United States Patent [19]

Petronio

[11] Patent Number: 5,008,525

[45] Date of Patent: Apr. 16, 1991

[54] CURRENT MONITORING CIRCUIT ERROR COMPENSATION

[75] Inventor: Carlo F. Petronio, Ross Township, Allegheny County, Pa.

[73] Assignee: ABB Power T & D Company, Inc., Blue Bell, Pa.

[21] Appl. No.: 389,145

[22] Filed: Aug. 3, 1989

[51] Int. Cl.$^5$ .............................................. H01J 40/14
[52] U.S. Cl. ............................ 250/214 C; 250/214 R; 250/205
[58] Field of Search ................ 250/205, 214 R, 214 C, 250/227.21, 227.14; 324/96; 307/311

[56] References Cited

U.S. PATENT DOCUMENTS 4,498,004  2/1985  Adolfsson et al. ............. 250/227.21
4,745,357  5/1988  Miller .................................. 324/96

Primary Examiner—David C. Nelms
Assistant Examiner—Que Tan Le
Attorney, Agent, or Firm—A. J. Rossi

[57] ABSTRACT

In a measuring device including a magnetic-optic current transformer (2) defining an optical path having an input (4) and an output (6) and having an optical transmission characteristics such that the relation between optical energy supplied to the input (4) and optical energy arriving at the output (6) is a function of an electrical parameter being monitored, an electrically driven photoemitter (8) disposed for supplying optical energy to the optical path input (4), a photodetector circuit (10, 12) optically coupled to the optical path output (6) for producing an electrical signal representative of the optical power arriving at the output (6), and a control circuit (14,16) connected between the photodetector circuit (10,12) and the photoemitter (8) for controlling the light energy supplied by the photoemitter (8) and forming with the transformer (2) a high pass filter having a corner frequency, the control circuit (14,16) is composed of an amplifier (20) and a first compensation unit (24,26) connected to form a negative feedback path of the amplifier (20) for supplying a negative feedback signal which is linearly proportional to the optical power emitted by the photoemitter (8) for causing the corner frequency value to be independent of the relative between the optical power at the input (4) to the path and the optical power at the output (6) of the path; and a second compensation unit (R$_3$,R$_4$) is operatively connected for causing the corner frequency value to be independent of the temperature of the control circuit (2).

9 Claims, 3 Drawing Sheets

CURRENT MONITORING CIRCUIT ERROR COMPENSATION

BACKGROUND OF THE INVENTION

The present invention relates to arrangements for compensating inaccuracies occurring in measuring devices which include an optical path having an optical transmission characteristic which varies as a function of an electrical parameter being monitored.

For example, magneto-optic current transformers (MOCTs) vary the optical attenuation occurring in an optical path as a function of an alternating current being monitored. Typically, such a transformer is connected in an optical path having an electrically driven light source at its input end and a light receiver at its output end, with a circuit being connected between the light receiver and the light source for suppressing low frequency or long term, changes in the optical energy at the output end of the optical path.

FIG. 1 shows a known circuit for a magnetooptic current transformer (MOCT) 2. MOCT 2 is provided with a light entry port, a light exit port, a light transmission path between the ports, and means responsive to an electric current for influencing the optical characteristic of the light transmission path such that the relation between optical power, or light intensity, supplied at the light entry port and the optical power, or light intensity, appearing at the output port is a function of the instantaneous current amplitude In the circuit of FIG. 1, an input fiber 4 is coupled to the entry port and an outlet fiber 6 is coupled to the exit port of MOCT 2.

Essentially, the circuit provides an output voltage, $V_{out}$, corresponding to the alternating current acting on MOCT 2.

The circuit includes a photoemitter 8, which may be an infrared-emitting LED, for supplying optical energy to fiber 4 and a photoreceiver 10, such as a PIN diode photodetector, connected to receive optical energy emerging from fiber 6.

Photoreceiver 10 is connected to the input of a current-to-voltage converter stage 12 and to a source of a constant reference current, $I_o$. Stage 12 is composed essentially of a differential amplifier having a resistive feedback connection and operates to produce output voltage $V_{out}$ proportional to the optical power received by photoreceiver 10.

The remainder of the illustrated circuit serves to suppress long term variations in the optical power received by photoreceiver 10 by adjusting the optical power emitted by photoemitter 8 in a manner to oppose long term variations in the optical power received by photoreceiver 10.

For this purpose, the circuit further includes an integrator 14 connected to receive $V_{out}$ and a voltage-to-current converter 16 which includes a transistor Q1 and has an exponential transfer characteristic. These two units function in a known manner to control the optical power introduced into fiber 4 in a manner to offset long term, or low frequency, changes in the optical power received by photoreceiver 10.

The output signal from integrator 14 is supplied by a voltage divider composed of resistors R3 and R4, the center tap of which is connected to the base of a transistor Q1 to provide the input voltage to converter 16.

Analysis of the circuit shown in FIG. 1 indicates that with respect to the relation between the current being monitored and $V_{out}$, and without the exponential voltage-to-current converter 16, the circuit behaves like a single pole high pass filter having a corner frequency, cut-off frequency which varies as a direct function of the total optical attenuation, or reduction in optical power, between the output of photoemitter 8 and the input of photoreceiver 10. This corner frequency variation creates a corresponding phase shift in $V_{out}$ at the frequency of the current being measured. When $V_{out}$ is used for the generation of average power reading, this phase shift will result in a possibly significant error.

The use of a voltage-to-current converter 16 having an exponential characteristic reduces the rate of corner frequency variation with attenuation but, in practical devices, an attenuation variation of 10:1 still produces a corner frequency variation of 2:1.

SUMMARY OF THE INVENTION

It is an object of the present invention to eliminate, or at least reduce, reading errors due to changes in the attenuation occurring along the light path associated with a measuring device.

A more specific object of the invention is to reduce changes in the corner frequency of the signal processing circuit as a result of such attenuation.

The above and other objects are achieved, in accordance with the present invention, in a measuring device including an element defining an optical path having an input and an output and having an optical transmission characteristic such that the relation between optical energy supplied to the input and optical energy arriving at the output is a function of an electrical parameter being monitored, an electrically driven photoemitter disposed for supplying light energy to the optical path input, photodetector circuit means optically coupled to the optical path output for producing an electrical signal representative of the optical power arriving at the output, and a control circuit connected between the photodetector circuit means and the photoemitter for controlling the light energy supplied by the photoemitter and forming with the element a high pass filter having a corner frequency, by the improvement wherein the control circuit comprises means for causing the corner frequency value to be independent of the relation between the optical power at the input to the path and the optical power at the output of the path.

Based on a detailed analysis of the operation of the circuit shown in FIG. 1, the following equation provides an accurate approximation of the circuit corner frequency, $f_c$:

$$f_c = (\tfrac{1}{2}\pi)(I_e/P_e)(dI_e/dP_e)(q/KT)(R_3/(R_3+R_4))(I_o R_1/R_2 C_1),$$

where:

$f_c$ = the corner frequency, in Hz;

$I_e$ = the current through photoemitter 8, in mA;

$P_e$ = the optical power launched by photoemitter 8, in mW;

$dI_e/dP_e$ = the inverse of the slope of the $P_e$ vs. $I_e$ curve at the operating value of current $I_e$, in mA/mW;

q = electron charge, in Coulombs;

K = Boltzmann's constant, in Joules/°K;

T = the absolute junction temperature of transistor Q1, in °K; and $R_1$, $R_2$, $R_3$, $R_4$, $C_1$ and $I_o$ are as indicated in FIG. 1, in units of Ω, Farads and A, respectively.

As optical attenuation in MOCT 2, fibers 4 and 6, and associated connectors increases in the circuit shown in FIG. 1, the level of $P_e$ required to maintain $V_{out}$ at a selected average value increases and the values of $I_e/P_e$ and $dP_e/dI_e$ vary. The relationship between $P_e$ and $I_e$ in the circuit of FIG. 1 has the form shown in FIG. 2.

DESCRIPTION OF THE PREFERRED EMBODIMENTS

According to the present invention, variation of $f_c$ is prevented, or at least substantially reduced, by altering the $P_e$ vs. $I_e$ relationship so that $(I_e/P_e).(dP_e/dI_e)$ remains substantially constant.

According to preferred embodiments of the invention, this is achieved by controlling the voltage-to-current converter in such a manner that $P_e$ is substantially linearly proportional to the collector current of transistor Q1. Specifically, this is achieved by modifying the converter feedback path to provide a signal value proportional to $P_e$.

Figure 1:
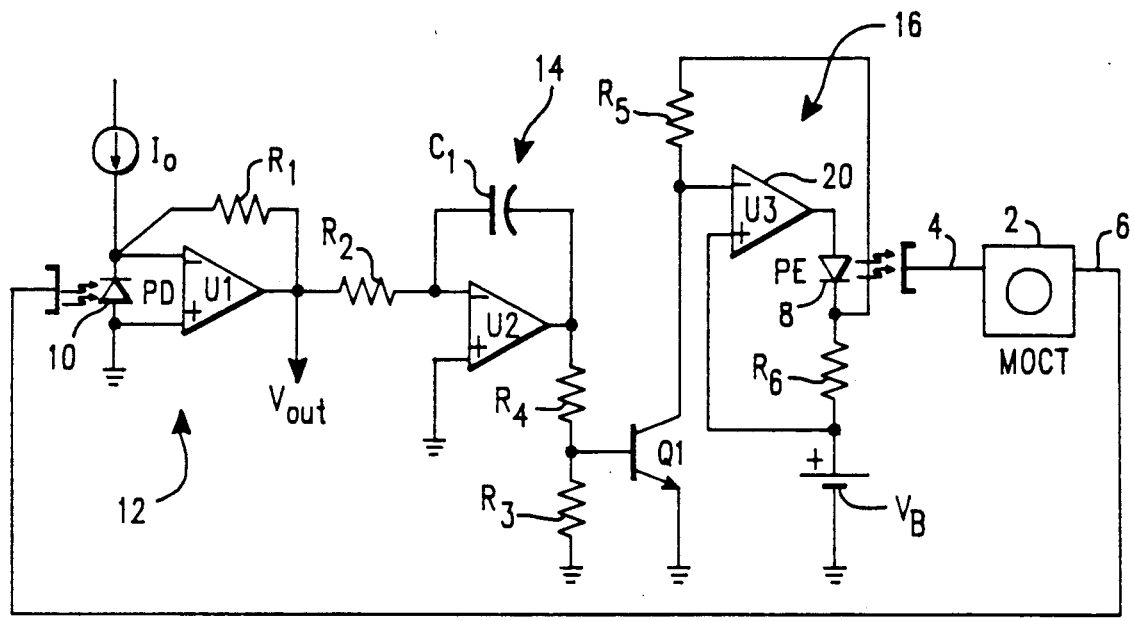
FIG. 1 is a circuit diagram of a MOCT circuit, which has already been described.
Figure 2:
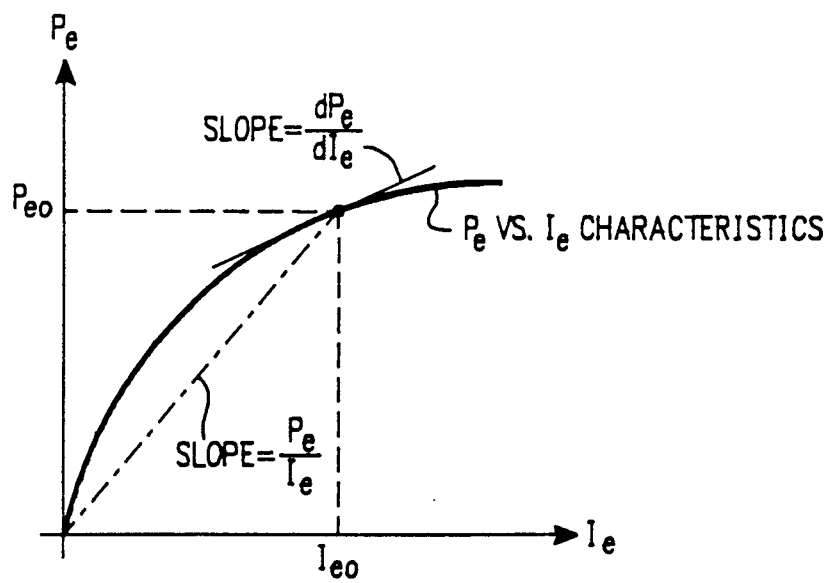
FIG. 2 is a diagram illustrating the typical operating characteristic of a photoemitter, such as an LED, or an IR emitting diode.
Figure 3A:
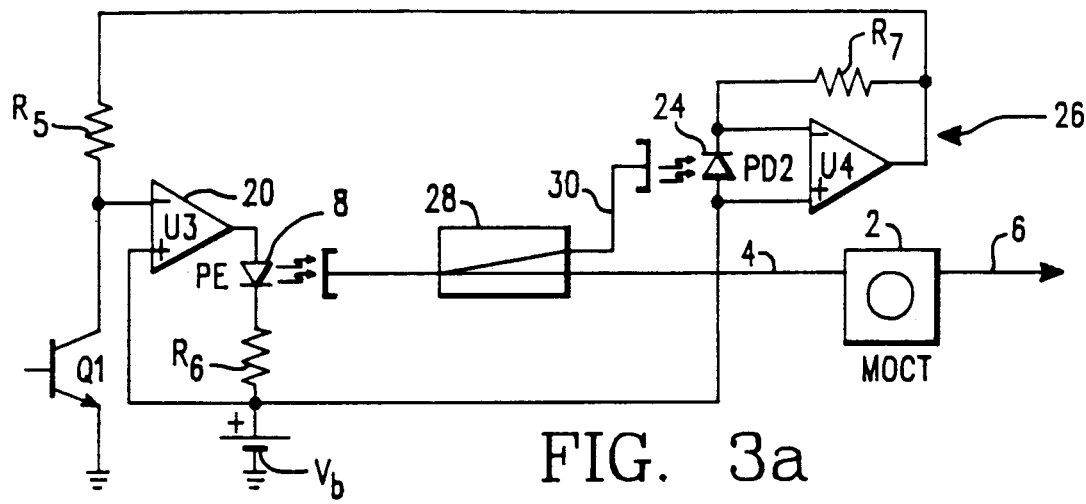
FIGS. 3a, 3b and 3c are circuit diagrams illustrating a part of the circuit of FIG. 1, modified according to three embodiments of the present invention.
Figure 3B:
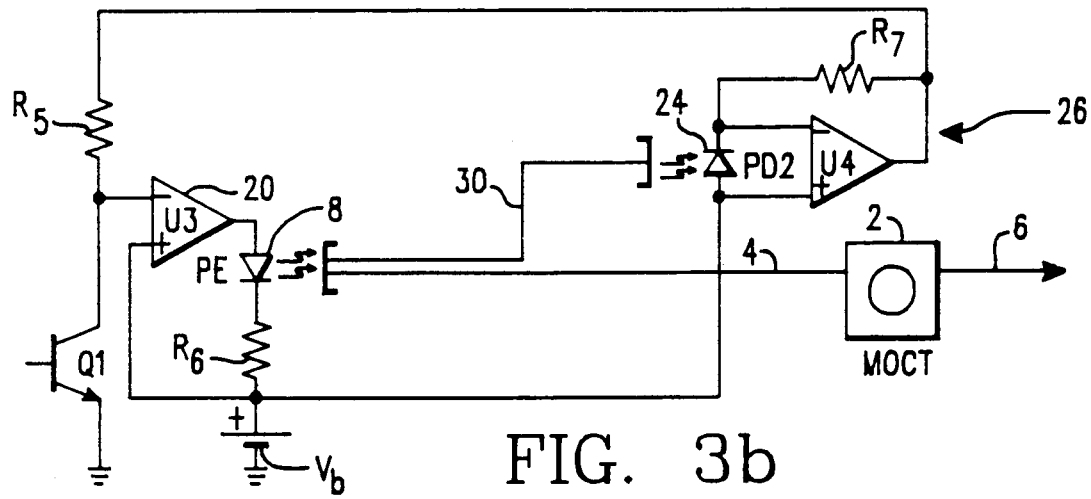
Figure 3C:
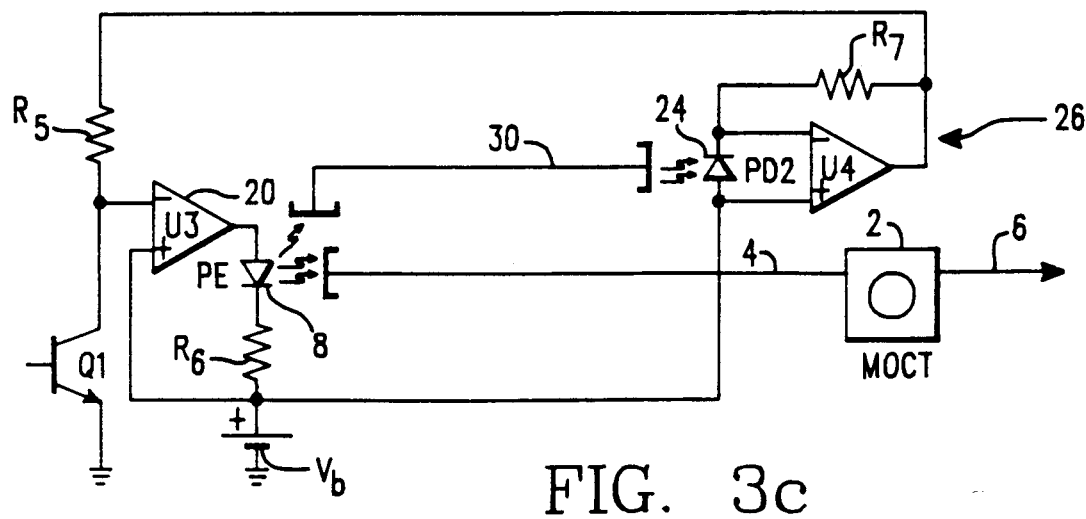
Figure 4:
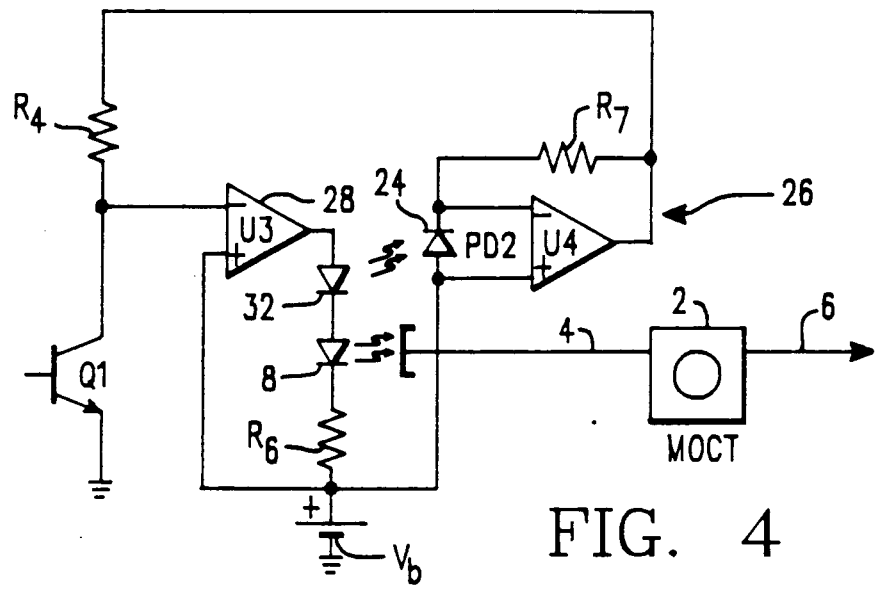
FIG. 4 is a circuit diagram illustrating a further embodiment of the invention.

FIGS. 3a, 3b and 3c show three embodiments of a converter circuit according to the invention using direct feedback from photoemitter 8, while FIG. 4 shows one embodiment of a circuit according to the invention employing indirect feedback.

In the embodiments shown in FIGS. 3a, 3b, 3c and 4, converter 16 includes an operational amplifier 20 whose output is connected to supply drive current to photoemitter 8. According to the invention, and in contrast to conventional practice, the optical energy produced by photoemitter 8 is employed to provide the feedback signal for amplifier 20. This is achieved by supplying a portion of the optical energy to a photoreceiver 24 connected to the input of a current-to-voltage converter 26.

In the circuit shown in FIG. 3a, a portion of the optical energy is supplied by an optical splitter 28 having an input optically coupled to photoemitter 8, a first output optically coupled to fiber 4, and a second output optically coupled to a fiber 30 which is in light transmitting communication with photoreceiver 24.

In the embodiment shown in FIG. 3b, fibers 4 and 30 are arranged in a single connector so as to both be in optical communication with photoemitter 8.

In the embodiment shown in FIG. 3c, photoemitter 8 is associated with a receptacle in which fibers 4 and 30 are connected.

In the embodiment shown in FIG. 4, a second photoemitter 32 is connected electrically in series with photoemitter 8 and is optically coupled directly to photoreceiver 24. To the extent that the operating characteristic of photoemitter 32 matches that of photoemitter 8, the desired compensation is achieved.

Figure 5A:
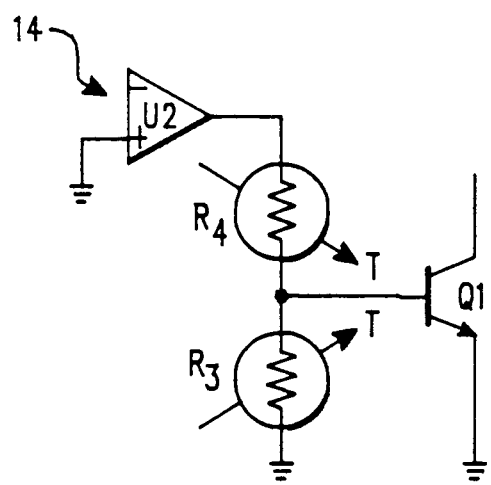
FIGS. 5a and 5b are circuit diagrams illustrating another part of the circuit of FIG. 1, modified according to another feature of the invention.

The equation for $f_c$ presented earlier herein shows that the corner frequency is also inversely proportional to absolute temperature and, according to a further feature of the invention, temperature dependent corner frequency variations are suppressed, or at least reduced, by employing, for $R_3$ and/or $R_4$, a temperature dependent resistor having a temperature characteristic such that:

$$R_3/(R_3+R_4) \approx T$$

at least over a temperature range of interest. Preferably $R_3$ is given a positive temperature coefficient and $R_4$ a negative temperature coefficient so that $R_3+R_4$ remains constant. An arrangement of this type is shown in FIG. 5a.

Figure 5B:
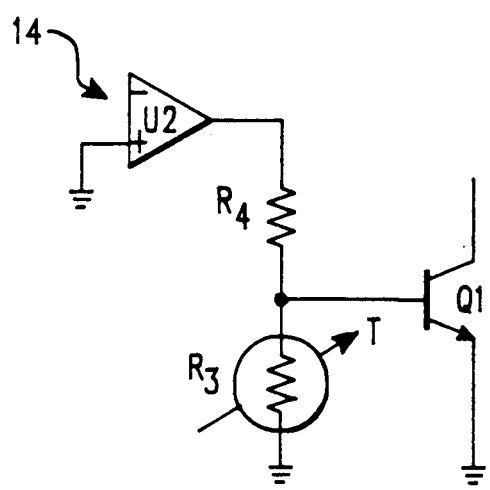

Approximate temperature compensation can be achieved by giving $R_3$ a positive temperature coefficient and allowing $R_4$ to remain constant if $R_4 >> R_3$. An arrangement of this type is shown in FIG. 5b.

Of course this temperature compensation is of less significance than the compensation relating to the $P_e - I_e$ characteristic and will therefore be used in combination with the correction illustrated in FIGS. 3 and 4.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. In a measuring device including an element defining an optical path having an input and an output and having an optical transmission characteristic such that the relation between optical energy supplied to the input and optical energy arriving at the output is a function of an electrical parameter being monitored, an electrically driven photoemitter disposed for supplying optical energy to the optical path input, photodetector circuit means optically coupled to the optical path output for producing an electrical signal representative of the optical power arriving at the output, and a control circuit connected between the photodetector circuit means and the photoemitter for controlling the light energy supplied by the photoemitter, the element and the control circuit together forming a high pass filter having a corner frequency, the improvement wherein said control circuit comprises compensation means for causing the corner frequency value to be independent of the relation between the optical power at the input to the path and the optical power at the output of the path.

2. A device as defined in claim 1 wherein said control circuit comprises an amplifier and said compensation means are connected to form a negative feedback path of said amplifier for supplying a negative feedback signal which is linearly proportional to the optical power emitted by said photoemitter.

3. A device as defined in claim 2 wherein said compensation means comprise an optical component connected to receive a defined portion of the optical energy emitted by said photoemitter.

4. A device as defined in claim 3 comprising an optical splitter having an input optically coupled to said photoemitter, a first output optically coupled to said optical path input, and a second output optically coupled to said optical component.

5. A device as defined in claim 2 wherein said compensation means comprise a second photoemitter connected to said control circuit in order to produce optical energy in an amount proportional to that produced by said first recited photoemitter.

6. A device as defined in claim 1 wherein said control circuit further comprises a circuit whose temperature influences the corner frequency value and second compensation means operative for causing the corner frequency value to be independent of changes in that temperature.

7. A device as defined in claim 6 wherein said second compensation means comprise at least one temperature dependent resistance.

8. A device as defined in claim 1 wherein said element comprises a magneto-optic current transformer.

9. In a measuring device including a magneto-optic current transformer defining an optical path having an input and an output and having an optical transmission characteristic such that the relation between optical energy supplied to the input and optical energy arriving at the output is a function of an electrical parameter being monitored, an electrically driven photoemitter disposed for supplying optical energy to the optical path input, photodetector circuit means optically coupled to the optical path output for producing an electrical signal representative of the optical power arriving at the output, and a control circuit connected between the photodetector circuit means and the photoemitter for controlling the light energy supplied by the photoemitter, the transformer and the control circuit together forming a high pass filter having a corner frequency, the control circuit comprising a circuit unit whose temperature influences the corner frequency value the improvement wherein said control circuit further comprises: an amplifier and first compensation means connected to form a negative feedback path of said amplifier for supplying a negative feedback signal which is linearly proportional to the optical power emitted by said photoemitter for causing the corner frequency value to be independent of the relation between the optical power at the input to the path and the optical power at the output of the path; and second compensation means operatively connected for causing the corner frequency value to be independent of the temperature of said circuit unit.

* * * * *